United States Patent
Jiang et al.

(10) Patent No.: US 6,834,292 B2
(45) Date of Patent: Dec. 21, 2004

(54) MULTI-RATE DIGITAL FILTER FOR AUDIO SAMPLE-RATE CONVERSION

(75) Inventors: Zhongnong Jiang, Plano, TX (US); Rustin W. Allred, Plano, TX (US); James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/219,145

(22) Filed: Aug. 15, 2002

(65) Prior Publication Data

US 2003/0172098 A1 Sep. 11, 2003

Related U.S. Application Data

(63) Continuation of application No. 09/277,696, filed on Mar. 26, 1999.

(51) Int. Cl.[7] ............................................. G06F 17/17
(52) U.S. Cl. ........................................ 708/313; 341/61
(58) Field of Search ................................ 708/313, 319; 341/61

(56) References Cited

U.S. PATENT DOCUMENTS

| | | | |
|---|---|---|---|
| 4,565,918 A | 1/1986 | McNally et al. | |
| 4,748,578 A | 5/1988 | Lagadec et al. | |
| 4,780,892 A | 10/1988 | Lagadec | |
| 4,825,398 A | 4/1989 | Koch et al. | |
| 5,583,887 A | 12/1996 | Murata et al. | |
| 5,712,635 A | 1/1998 | Wilson et al. | |
| 5,717,617 A | 2/1998 | Chester | |
| 5,732,004 A | 3/1998 | Brown | |
| 5,757,867 A | 5/1998 | Caulfield et al. | |
| 5,880,980 A | 3/1999 | Rothacher et al. | |
| 5,903,482 A | 5/1999 | Iwamura et al. | |
| 6,052,701 A | 4/2000 | Koslov et al. | |
| 6,137,349 A | 10/2000 | Menkhoff et al. | |
| 6,160,502 A | 12/2000 | Ihm | |
| 6,298,361 B1 | 10/2001 | Suzuki | |

FOREIGN PATENT DOCUMENTS

| | | |
|---|---|---|
| EP | 0 427 377 A | 5/1991 |
| FR | 2 326 079 A | 4/1977 |

OTHER PUBLICATIONS

Lagadec, Roger, et al., "A 2–Channel, 16–Bit Digital Sampling Frequency Converter for Professional Digital Audio," International Conference on Acoustics, Speech & Signal Processing, ICASSP, US, New York, IEEE, vol. Conf. 7, May 3, 1982, pp. 93–96, XP002030389.

(List continued on next page.)

*Primary Examiner*—Tan V. Mai
(74) *Attorney, Agent, or Firm*—J. Dennis Moore; W. James Brady, III; Frederick J. Telecky, Jr.

(57) ABSTRACT

In a microprocessor, a method for providing a sample-rate conversion ("SRC") filter on an input stream of sampled data provided at a first rate, to produce an output stream of data at a second rate different from the first rate. The input stream of sampled data is operated on with a first low-order interpolation filter routine to produce a first stream of intermediate data. The first stream of intermediate data is operated on with a first simplified interpolation filter routine, having a substantially small number of operations to calculate the coefficients thereof, to produce a second stream of intermediate data. The second stream of intermediate data is operated on with a first decimating filter routine to produce the output stream of data.

22 Claims, 3 Drawing Sheets

OTHER PUBLICATIONS

Bevan, William R., "A Simplified Equalization Analyzer," Journal of the Audio Engineering Society, vol. 26, No. 3, pp. 120–129, Mar. 1978.

Crochiere, Ronald E., et al., "Interpolation and Decimation of Digital Signals—A Tutorial Review," Proc. IEEE, vol. 69, No. 3, pp. 300–331, Mar. 1981.

Adams, Robert, et al., "A Stereo Asynchronous Digital Sample–Rate Converter for Digital Audio," IEEE Journal of Solid–State Circuits, vol. 29, No. 4, pp. 481–488, Apr. 1994.

Park, Sangil, et al., "A Novel Structure for Real–Time Digital Sample–Rate Converters with Finite Precision Error Analysis," IEEE, pp. 3613–3616, 1991.

Ramstad, Tor A., "Digital Methods for Conversion Between Arbitrary Sampling Frequencies," IEEE Transactions on Acoustics, Speech, and Signal Processing, vol. ASSP–32, No. 3, pp. 577–591, Jun. 1994.

Cucchi, S., et al., "DSP Implementation of Arbitrary Sampling Frequency Conversion for High Quality Sound Application," IEEE, pp. 3609–3612, 1991.

MULTI-RATE DIGITAL FILTER FOR AUDIO SAMPLE-RATE CONVERSION

This application is a continuation of and claims priority under 35 USC § 120 of application Ser. No. 09/277,696, filed Mar. 26, 1999.

TECHNICAL FEILD OF THE INVENTION

This invention relates to audio sample-rate conversion systems, and more particularly relates to multistage sample-rate conversion filters.

BACKGROUND OF THE INVENTION

For both historical and technical reasons, there have existed a number of industrial standards on audio digital signal sample rates. The well known examples are the 44.1 kHz sample rate for consumer CD players and 48 kHz for professional digital audio. This, in turn, has given rise to sample-rate conversion ("SRC") systems for converting a stream of digital data at one sample rate to a stream of digital data at a different sample rate. However, the cost of existing SRC systems is high. This imposes a severe constraint in designing more affordable digital audio products that apply to various source signals.

Early implementations of SRC systems were done in a hybrid digital/analog domain. They were relatively simple, since all that is needed is a digital-to-analog (D/A) converter followed by an analog-to-digital (A/D) converter. The D/A converter runs at the input sample rate while the A/D converter is controlled by the output sample rate. If the output sample rate is lower, an analog anti-aliasing filter is provided between them. These three components are expensive and consume a large amount of power, if designed for minimum signal degradation.

Performing sample-rate conversion (SRC) in the digital domain has been a research/development topic for more than a decade. The article by R. E. Crochiere and L. R. Rabiner, "Interpolation and decimation of digital signals-A tutorial review," *Proc. IEEE*, vol. 69, pp. 300–331, March 1981, is an excellent reference for understanding fundamental insights from early research results in this art area. Real-time, all-digital SRC systems are becoming more and more significant because digital processing of signals, such as voice, audio and video, appears to be increasingly dominant over traditional analog methods thanks to higher signal quality, rich features and the continually lowering cost of digital signal processing.

FIG. 1 shows a typical, all-digital SRC system 10 consisting of three basic building blocks: an interpolator (expander) 12, a high quality lowpass digital filter 14, and a decimator 16. The expander 12 takes an input stream of samples at one frequency, for example $F_{s\_in}$, and digitally produces a stream of digital samples at a higher rate that is an integer multiple, designated R in this example, of the input rate. Thus, the output of expander 12 is a stream of digital samples at a rate of $F_{s\_out}=R\,F_{s\_in}$. The decimator does the reverse. Thus, the decimator 16 takes an input stream of samples at one frequency, for example $X=R\,F_{s\_in}$, and digitally produces a stream of digital samples at a lower rate, divided by an integer division factor, designated S in this example, of the input rate. This is referred to as decimation, or, alternatively, downsampling. Thus, the output of decimator 16 is a stream of digital samples at a rate of $X/S=F_{s\_out}=(R/S)F_{s\_in}$.

The reason for performing expansion followed by decimation is that the input sample rate and the output sample rate may not be a simple integer multiple of one another. The ratio of the interpolation factor R over the decimation factor S is the SRC ratio R/S where both R and S are positive integers. For R>S the SRC system is said to be operated in an SRC-UP mode, whereas an SRC-DOWN mode means R<S.

R and S may be chosen to have large values in order to achieve higher quality SRC. However, when the values of R and S are high, very-high order digital filters, usually finite impulse response ("FIR") digital filters, are necessary. Thus, as S and R increase, a greatly increasing amount of coefficient memory is required. For example, at a sample rate of 48 kHz an equi-ripple prototype FIR filter with transition bandwidth of $\Delta f=4$ kHz, passband ripples=$10^{-3}$ and stopband errors=$10^{-5}$, has an order of approximately 128. The order of lowpass filter 14 in FIG. 1 is 128R for an interpolation filter (R is the interpolation factor up to over 1000).

It is actually quite difficult or even impossible as a practical matter to design an equi-ripple FIR filter with tens of thousands of orders. In fact, the major difficulty encountered in existing audio SRC system, implemented either in an application-specific integrated circuit (ASIC) or on a programmable digital signal processor (DSP) such as a Texas Instruments TMS320 series DSP chip, seems to be large memory size and high computational complexity. For example, an ASIC described in an article by R. Adams and T. Kwan, "A stereo asynchoronous digital sample-rate converter for digital audio," *IEEE J. Solid-State Circuits*, vol. 29, pp. 481–488, April 1994, needs tens of kilobytes of memory to store just a fraction of the nearly 10 million filter coefficients used.

Moreover, filter coefficient interpolation, which is performed to generate thousands of sets of required polyphase filter coefficients in real time, expends significant computational power which is provided by a hardware multiplier plus an accumulator. A similarly difficult situation is also encountered when a programmable DSP chip is employed. For example, see the article by S. Park et al., "A novel structure for real-time digital sample-rate converters with finite precision error analysis," *Proc. Int. Conf. on Acoust, Speech and Signal Processing*, pp. 3613–3616, Toronto, 1991. Several kilobytes of memory are employed in these SRC systems for filter coefficients alone, in addition to their computational complexities falling in the neighborhood of 10 MIPs for one channel of high quality audio.

Therefore, attempts have been made using window techniques, for example using a Kaiser window, to design extremely high-order FIR filters. By using an interpolation technique in calculating required coefficients in real-time, a single-stage SRC filter system, such as the system 10 shown in FIG. 1, has become closer to practical, and hardware implementation examples have been reported. Examples may be found, e.g., in U.S. Pat. Nos. 4,780,892, 4,564,918, 4,825,398 and 4,748,578. However, these implementations fall short of the desired efficiencies allowing their utilization in affordable digital audio products for consumers.

Other attempts at avoiding the use of high-order filters make use of special functions such as Lagrange polynomials or B-spline functions. See, for example, T. O. Ramstad, "Digital methods for conversion between arbitrary sampling frequencies," *IEEE Trans. Acoust, Speech and Signal Processing*, vol. ASSP-32, pp. 577–591, June 1984, for an article on the former, and S. Cucchi et al., "DSP implementation of arbitrary sampling frequency conversion for high quality sound application," *Proc. Int. Conf. on Acoust, Speech and Signal Processing*, pp. 3609–3612, Toronto, 1991, for the latter. These methods, however, all have the drawback of requiring a very large number of computations.

It is known that multistage decimation or interpolation filters are generally more efficient than single-stage filters, in terms of computational complexity. It appears that the same conclusion also holds on memory requirements of multistage filters over single-stage versions. It would therefore be desirable to have a multi-stage scheme employing a far smaller memory than required in the prior art to store some of the SRC filter coefficients, and have an accompanying arrangement for efficiently calculating the rest of the filter coefficients, in real time.

Therefore, it is an object of this invention to provide an efficient multistage multi-rate filter. It is also an object of the present invention to provide a multistage SRC filter that is more efficient in both computational and memory requirements than prior art multistage SRC filter implementations. It is a further object of the present invention to provide a multistage SRC that represents a balance of resource considerations.

SUMMARY OF THE INVENTION

In accordance with the present invention there is provided a method for providing a sample-rate conversion ("SRC") filter on an input stream of sampled data provided at a first rate, to produce an output stream of data at a second rate different from the first rate. The input stream of sampled data is operated on with a first low-order interpolation filter routine to produce a first stream of intermediate data. The first stream of intermediate data is operated on with a first simplified interpolation filter routine, having a substantially small number of operations to calculate the coefficients thereof, to produce a second stream of intermediate data. The second stream of intermediate data is operated on with a first decimating filter routine to produce the output stream of data.

Implementations of the present invention can exhibit excellent characteristics such as an extremely low memory requirement, simple design and implementing procedure and moderate computational complexity.

Filter performance of the new implementations can easily reach 100 dB signal-to-noise-ratio (SNR) level. The simplicity inherent in the present invention allows hardware implementation, by using either an ASIC or a programmable DSP chip, to be easier and more straightforward than heretofore.

These and other features of the invention will be apparent to those skilled in the art from the following detailed description of the invention, taken together with the accompanying drawings.

DETAILED DESCRIPTION OF THE PREFERRED EMBODIMENT

Figure 1:
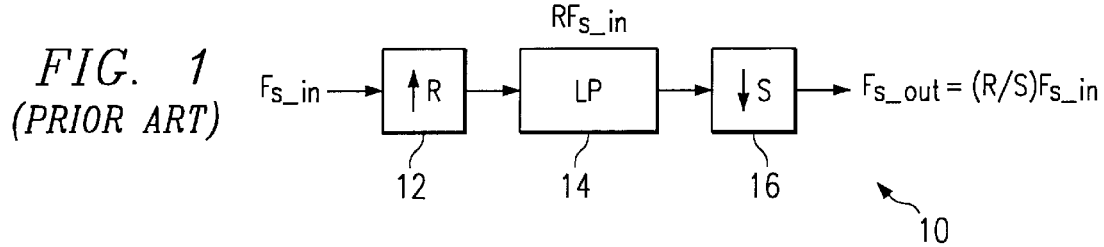
FIG. 1 is a block diagram showing a typical, all-digital SRC system.
Figure 2:
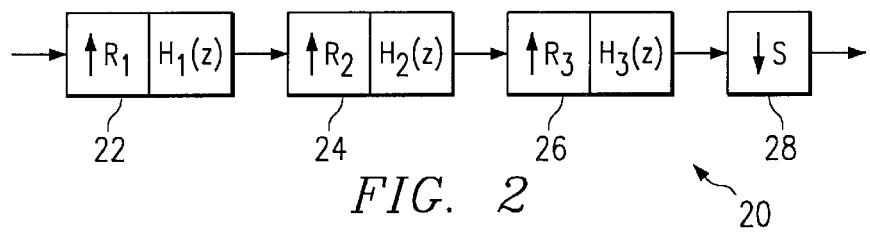
FIG. 2 is a block diagram showing a preferred embodiment of the present invention.

The four stage SRC filter structure 20 depicted in FIG. 2 is a block diagram of a preferred embodiment of the present invention. It represents an excellent balance between easy design procedure, reduced memory/computation needs, and simple system control flow. The SRC filter structure 20 comprises a stage-1 expander/filter 22, a stage-2 expander/filter 24, a stage-3 expander/filter 26 and a stage-4 decimator 28. The stage-4 decimator 28 can be a simple factor of S prior art decimator, and so the discussion that follows focuses on how best to apply the principles of the present invention to design efficiently embodiments of the first three filters in stages 1, 2 and 3, and how to design them for optimum performance. As an initial matter in that regard, only FIR filters are utilized in the embodiments disclosed herein, because they offer linear phase responses and efficient polyphase implementations in multirate processing. However, infinite impulse response ("IIR") digital filters may be used, if desired.

Further, while the embodiment of the present invention disclosed in detail herein utilizes three expander/filter stages, this is only preferred, but not required. Two of such stages, or, alternatively, greater than three such stages may be used in the application of the principles of the present invention, and still remain within the scope of the present invention as defined by the appended claims.

Now, returning to the preferred embodiment, the stage-1 expander/filter 22 performs an interpolation of factor $R_1$. The value of $R_1$ is relatively small so that the transition bandwidth of the stage-1 expander/filter 22 is still reasonably large. The reason for this is that a large value of $R_1$, causing a high output sample rate at the stage-1 expander/filter 22, can lead to an extremely narrow transition band that, in turn, proportionally results in a very high-order for stage-1 filters, which is undesirable. It is desirable to maintain the order of the stage-1 filter between 100 and 800.

With a small vale of $R_1$, the output sample rate in the stage 2 expander/filter 24 is relatively high. However, even though the output sample rate is significantly higher in the stage-2 expander/filter 24 than in the previous stage, the transition band of the stage-2 expander/filter 24 can be more relaxed than that of stage 1 since a large number of the image bands have been already removed by the stage-1 expander/filter 22, preferably at least half of the image bands. The selection of $R_2$ is not arbitrary, however, because it is desirable to simplify the stage-3 expander/filter 26 given that it is running at a rather high sample rate, $R_1 R_2 F_{s\_in}$. Thus, the choice of $R_2$ depends on how the stage-3 expander/filter 26 is designed.

The design aspects of the stage-3 expander/filter 26 occupy a significant role in the design of the preferred embodiment of the present invention. A key aspect is that the stage-3 expander/filter 26 is a relatively simple filter. Simple filters have trivial filter coefficients, and the simplest non-zero filter coefficients are simply ones. Further, the stage-3 expander/filter 26 is cascaded. As a general design matter, it should be appreciated that a trivial-coefficient-based filter can perform acceptably if it is cascaded, even if only two times.

The underlying principles for the stage-3 expander/filter 26 are now described. Let the stage-3 expander/filter 26 be a cascade of r all-one-coefficients filters that are described by:

$$H_3(z) = \left(\sum_{k=0}^{R_3-1} z^{-k}\right)^r \qquad \text{Eq. (1)}$$

Notice that, for simplicity, a normalization factor has been omitted in Equation (1). Using the filter described by Equation (1) in stage 3 substantially removes a significant hurdle that has existed heretofore in designing SRC systems: huge storage requirements for filter coefficients. As is shown below, the coefficients of $H_3(z)$ can be evaluated based on very simple equations when r is small, say r=2 or 3. The magnitude response of $H_3(z)$ is easily evaluated as:

$$|H_3(e^{j\omega})| = \left(\frac{\sin(\omega R_3/2)}{\sin(\omega/2)}\right)^r \qquad \text{Eq. (2)}$$

The function of $H_3(z)$ is to eliminate the image bands introduced by padding (i.e., inserting) zero-value samples between input samples of stage 3. Furthermore, the monotonic property of $H_3(z)$ between DC and the frequency $\omega_0=2\pi/R_3$, at which the filter frequency response reaches its first null value, allows the evaluation of Equation (2) at just two digital frequency points to determine the performance of the filter. The first point is $$\omega_1 = 2\pi \frac{f_p}{RF_{s\_in}},$$

where $f_p$ denotes maximum frequency of base band signals, and $R=R_1R_2R_3$ is the interpolation factor of the whole SRC system. At $\omega_1$:

$$|H_3(e^{j\omega_1})| = \left(\frac{\sin\left(\frac{\pi f_p}{R_1 R_2 F_{s\_in}}\right)}{\sin\left(\frac{\pi f_p}{RF_{s\_in}}\right)}\right)^r \qquad \text{Eq. (3)}$$

This expression gives the maximum droop in the passband of the stage-3 expander/filter 26. Thus $\omega_2=\omega_0-\pi/R$ represents the edge frequency of the first stopband of the stage-3 filter, and the corresponding frequency response at $\omega_2$ is:

$$|H_3(e^{j\omega_2})| = \left(\frac{\sin\left(\frac{\pi(2R-R_3)}{2R}\right)}{\sin\left(\frac{\pi(2R-R_3)}{2RR_3}\right)}\right)^r \qquad \text{Eq. (4)}$$

Note the following useful information that is evident from the above expression:
Increasing the value of $R_1R_2$ can greatly improve the filter performance of stage 3 in both passband and stopband. In other words, the first image band is located further away from base band as $R_1R_2$ increases.
For large values of $R_3$, which indeed is the case in many SRC applications, the frequency responses at $\omega_1$ and $\omega_2$ asymptotically become independent of $R_3$.
To quantitatively examine the filter performance of stage 3 at both $\omega_1$ and $\omega_2$ several useful cases are evaluated and shown in Table 1 with these parameters: $R_3=256(2^8)$, $f_p=20$ kHz and $F_{s\_in}=48$ kHz.

TABLE 1

| Stage-3 Filter Performance | | | |
|---|---|---|---|
| $R_1$ | $R_2$ | $H(e^{j\omega_1})$ (dB) | $H(e^{j\omega_2})$ (dB) |
| 2 | 4 | −0.087r | −23.6r |
| 2 | 8 | −0.022r | −29.8r |
| 2 | 16 | −0.006r | −36.0r |
| 2 | 32 | −0.001r | −42.1r |
| 2 | 64 | −0.0003r | −48.1r |
| 2 | 128 | −0.0001r | −54.2r |

A value of r=3 is an optimally balanced selection, and is considered preferred. It will be clear from an inspection of Table 1 that a value of r=1 does not provide nearly adequate filter performance in most applications, although the filter coefficients are indeed trivial.

With r=2, the coefficients of $H_3(z)$ still remain quite simple:

$$h_3(n)=n \quad 1\leq n\geq R_3 \qquad \text{Eq. (5)}$$

Notice that the other half ($R_3-1$) of the filter coefficients ($R_3+1\leq n\geq 2R_3-1$) can be obtained from symmetry. Although this filter provides good filter performance, over 100 dB stopband rejection for digital processing of audio signals is often desired. This requires the value of $R_1R_2$ to be at least 256. It will be recalled that it is preferable to use $R_1=2$ for the reason previously described. If $R_1$ is selected to be 2, then to maintain the value of $R_1R_2$ as at least 256, $R_2$ must be 128 or even larger. Therefore, the sample rate at the output of the stage-2 expander/filter 24 reaches a minimum of $256F_{s\_in}$. That is over 10 MHz when $F_{s\_in}=44.1$ kHz or higher. Also, for $R_2=128$, the order of the stage-2 expander/filter 24 may well increase to over a thousand in order to retain high filter performance. An order of one thousand means large amounts of memory are required, which is undesirable. It is desirable to maintain the order of the stage-2 filter between 100 and 1200.

Figure 3:
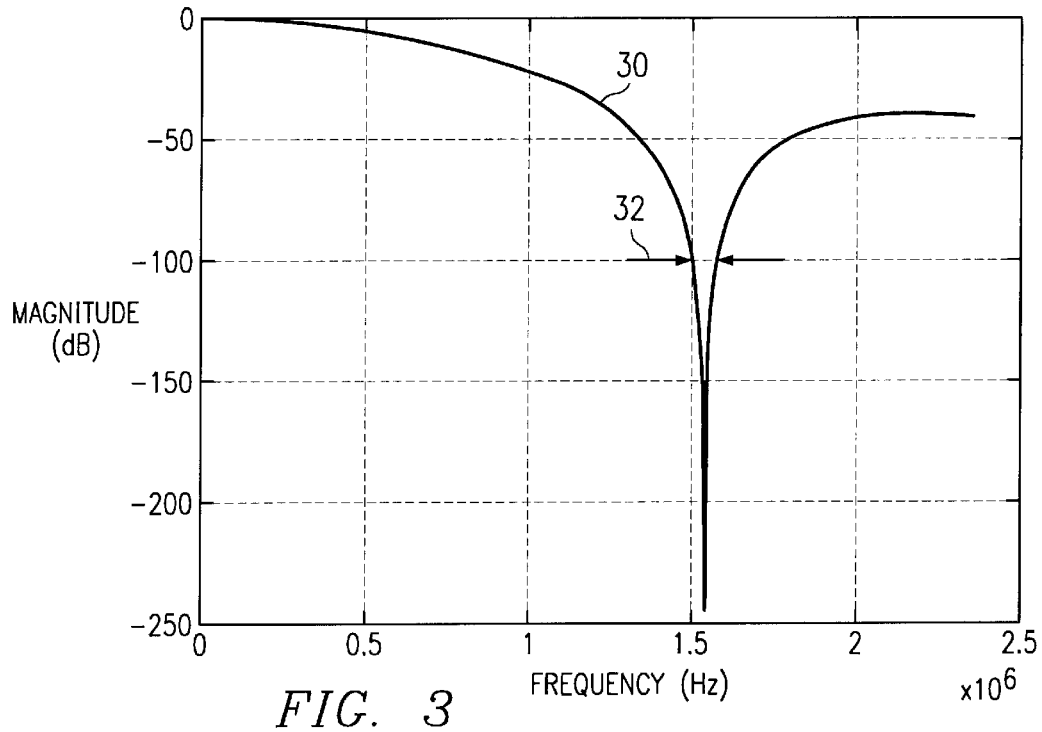
FIG. 3 is a graph showing the frequency response of a stage-3 filter, with r=3.

With r=3, a high-quality filter is easily achieved even though $R_1R_2$ has a moderate value. FIG. 3 is a chart in which the horizontal axis represents frequency in Hertz and the vertical axis represents magnitude of response in dB, showing such a filter's frequency response 30 within a frequency range including the first stopband 32 that rejects the first image band. The first stopband 32, or equivalently, image band, starts at 1512 kHz and ends at 1560 kHz with the first null sitting at 1536 kHz.

The filter coefficients when r=3 can be evaluated by the following expression:

$$h_3(n) = \begin{cases} \dfrac{n(n+1)}{2} & 1\leq n\geq R_3-1 \\ \dfrac{R_3(R_3+1)}{2} - (R_3-n)(2R_3-1-n) & R_3\leq n\leq \dfrac{3R_3}{2}-1 \end{cases} \qquad \text{Eq. (6)}$$

Notice that $R_3$ has been assumed to be an even number, and again only half of the symmetric coefficients are described in Equation (6). The end summing index in Equation (6) simply changes to $(3R_3-1)/2$ if an odd integer of $R_3$ is chosen. The evaluating procedure to obtain those coefficients is sufficiently straightforward to allow computation in real time. Thus, each set of polyphase components of $H_3(z)$ consists of at most three integers that require a total of only three integer multiplications and several additions/ shifts. The largest coefficient of $H_3(z)$ is given by $3R_3R_3/4=3\times2^{14}$ for $R_3=2^8$, requiring merely 16-bit precision, which, in turn, requires only 16-bit registers.

Given r=3, $R_2$ can be chosen as 8 or 16 for audio SRC applications. In the following design examples $R_2$=16 and $R_3$=256. If strict passband performance is required a simple filter can be employed with several taps to pre-distort the base-band signals such that the droop in the passband introduced by the stage-3 expander/filter 26 is well compensated.

It is well known that filters with fixed coefficients can be implemented more efficiently than those having programmable coefficients. This is particularly true when implementing filters in ASICs. Therefore, when implementing $H_3(z)$, since the coefficients are determined by the value of $R_3$ and calculated in real time, the design must be general enough to accommodate every possible set of filter coefficients that will arise in a particular implementation. In any event, it is desirable to maintain $R_3$ between 100 and 10,000.

Upon having chosen the value of $R_2$ the stage-2 expander/filter 24 can easily be made with fixed coefficients. Those fixed coefficients can further be represented by canonical signed digits (CSD) form to greatly simplify computations by using add/shift operations rather than normal multiplications. Even by using a programmable DSP chip, fixed coefficients are easier to handle than time-varying coefficients.

In implementing an embodiment of the present invention particular attention should be made in designing the first stage filter. In this regard, it should be noted that making distinct the considerations between SRC-UP and SRC-DOWN modes has so far been ignored in the discussion herein. This will now be discussed. The care that should be exercised in designing efficient stage-1 filters that are able to handle both UP and DOWN modes highlights an important design consideration when seeking the high efficiency achievable by the inventive SRC design methodology disclosed herein.

Some problems are encountered in design when UP modes are involved. They are discussed below. The function of the stage-1 filter simply erases the image band caused by the first interpolator. Therefore, the stage-1 expander/filter 22 can have fixed coefficients. But in DOWN modes, the stage-1 expander/filter 22 must remove high frequency components of the input signals in addition to cutting the image band off.

Two embodiments of the present invention are presented herein for solving this problem, in the form of two methods. In the first method, several stage-1 filters may be provided, each of which is suitable to a specific DOWN mode. The selection from those pre-set filters is easily done by feeding an index that points to a correct initial memory address of stored filter coefficients. If desired, those pre-computed coefficient sets can be stored in a host system such as a personal computer to save the memory on an ASIC or DSP chip.

The second method calls for a real-time computing scheme, similar to $H_3(z)$, that generates filter coefficients based on a generic set of filter coefficients and still meets the filter specifications. Note that this computing procedure needs to be executed only once when the SRC ratio is changed, and stays on until a new SRC ratio is invoked. Nonetheless, the first of these two methods is considered preferred, and that method is utilized in the following design examples.

Designing filters that can be employed for converting sample rates between 44.1 and 48 kHz, based on the above design guidelines, will now be considered.

A. Stage-1 Filters

Stage-1 filters having an order of 126 provide adequate filter performance and require acceptable amounts of memory and computational complexities. In the UP mode, i.e., the 44.1·>48 kHz case, a 126th-order FIR filter can provide over 100 dB stopband rejection and maintain up to 20 kHz passband signals. It is also possible to employ a half-band FIR filter if a somewhat greater number of aliasing errors can be tolerated in the transition band from 20 kHz to 24 kHz. In half-band FIR filters one of the two polyphase sub-filters is a delay element. Therefore half-band FIR filters need nearly 50% lower computations and coefficient memory in comparison to normal FIR filters with the same filter orders. To further reduce computations, symmetry in filter coefficients can be used. Indeed, by selecting an even-order, half-band FIR filters have polyphase components with symmetrical coefficients.

In the DOWN mode, however, a 126th-order FIR filter can only maintain a passband of about 18.5 kHz if the 100 dB stopband rejection requirement applies.

Actual filter coefficients for a Stage-1 filter used in a Matlab simulation of an embodiment of the present invention are found in Appendix A. The designer may wish to select other coefficients to accommodate specific application constraints and/or performance objectives. Optimal quantization of filter coefficients may be considered by the designer, as well. All of such variations are well within the purview of those of ordinary skill in this art area.

B. Stage-2 Filters

Only the stage-2 expander/filter 24 should have fixed coefficients that are independent of the SRC mode. To be consistent with the filter performance in the stage-1 expander/filter 22 configured as described above, a 143rd-order FIR filter should be used. The order number 143 offers an advantage in that every polyphase component has the same number of coefficients, that is, nine, when $R_2$=16. Although the polyphase components may no longer have symmetric coefficients, half of the polyphase components have coefficients that are mirror-symmetric with their counterparts in the other half of the polyphase components. Such a property may be exploited to save coefficient memories.

Actual filter coefficients for a Stage-2 filter used in a Matlab simulation of an embodiment of the present invention are found in Appendix B. The designer may wish to select other coefficients to accommodate specific application constraints and/or performance objectives. Optimal quantization of filter coefficients may be considered by the designer, as well. All of such variations are well within the purview of those of ordinary skill in this art area.

In this connection, the designer may wish to consider for stage-2 filters a cascade of several half-band FIR filters having half zero filter coefficients, which results in a need for only half of the computations otherwise, as well as half of the memory requirement. The designer should keep in mind, however, that a drawback of using a cascade of several half-band FIR filters is the need for a more complicated indexing scheme than that described in the following sections.

C. Stage-3 Filters

This filter has already been discussed in detail in the previous section. Note, however, that it might be preferred to make this filter fully programmably controlled by selecting $R_3$ in real time. Remember that larger values of $R_3$ require higher dynamic ranges in filtering computations.

Since the impulse response of this filter is very smooth, it is possible to compress the coefficients. Piecewise linearization may be used, for example. However, since the coefficients are already easily calculated, and since the filtering operation does not use neighboring coefficients in the computation of any given output sample, it is not clear that significant savings would result from compression, but the implementation enhancement is suggested in the interest of full disclosure.

D. Implementation Architecture

Figure 4:
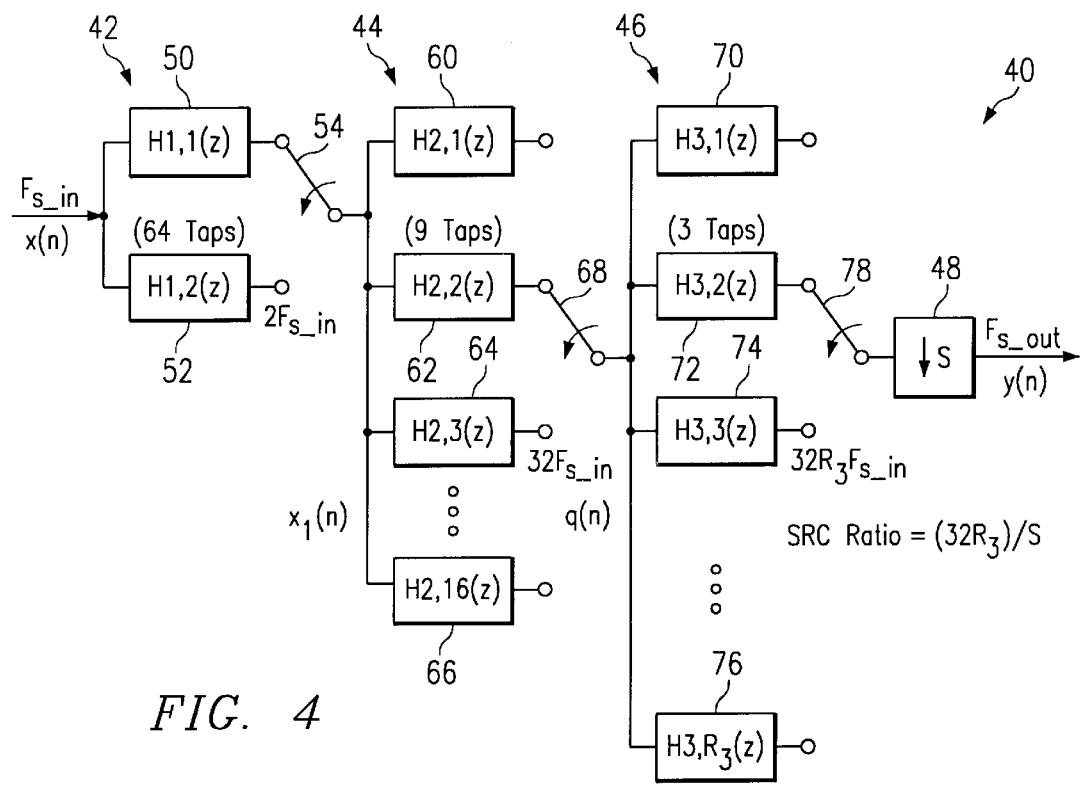
FIG. 4 is a more detailed diagram of a preferred embodiment of the present invention.

A more detailed diagram of a preferred implementation of the new SRC filter is shown in FIG. 4. The SRC filter 40 includes three expander/filter stages 42, 44, 46, and a decimator stage 48. The stage-1 expander/filter 42 includes two polyphase sub-filters 50, 52, corresponding to $R_1=2$, each receiving the input x(n) provided at a sample rate of $F_{s\_in}$. The outputs of polyphase sub-filters 50, 52, are selected at a rate of $2F_{s\_in}$, as shown by switch 54, and provided at that rate as the input $x_1(n)$ to the stage-2 expander/filter 44.

The stage-2 expander/filter 44 includes sixteen polyphase sub-filters 60, 62, 64, . . . 66, corresponding to $R_2=16$, each receiving the input $x_1(n)$. The outputs of polyphase sub-filters 60, 62, 64, . . . 66, are selected sequentially and cyclically at a rate of $32F_{s\_in}$, as shown by switch 68, and provided at that rate as the input q(n) to the stage-3 expander/filter 46.

The stage-3 expander/filter 46 includes $R_3$ polyphase sub-filters 70, 72, 74, . . . 76, each receiving the input q(n). The outputs of polyphase sub-filters 70, 72, 74, . . . 76, are selected sequentially and cyclically at a rate of $32R_3F_{s\_in}$, as shown by switch 78, and provided at that rate as the input to the stage-4 decimator 48. The output of decimator 48 is the output y(n) of the SRC filter 40.

In practice, the stage-4 factor-S decimating must be merged into the three previous stages to avoid any redundant computations that are not related to output samples at a required sample rate. This is accomplished in the preferred embodiments herein by a novel indexing technique, explained below. The resulting memory size for the SRC filter coefficients is only 136 words, which is more than an order of magnitude reduction in comparison to the prior art SRC systems described in the article by R. Adams and T. Kwan, and the article by S. Park et al., cited above. On the other hand, the number of multiplications is 97 per output sample, a moderate quantity for a high quality SRC system.

Figure 5:
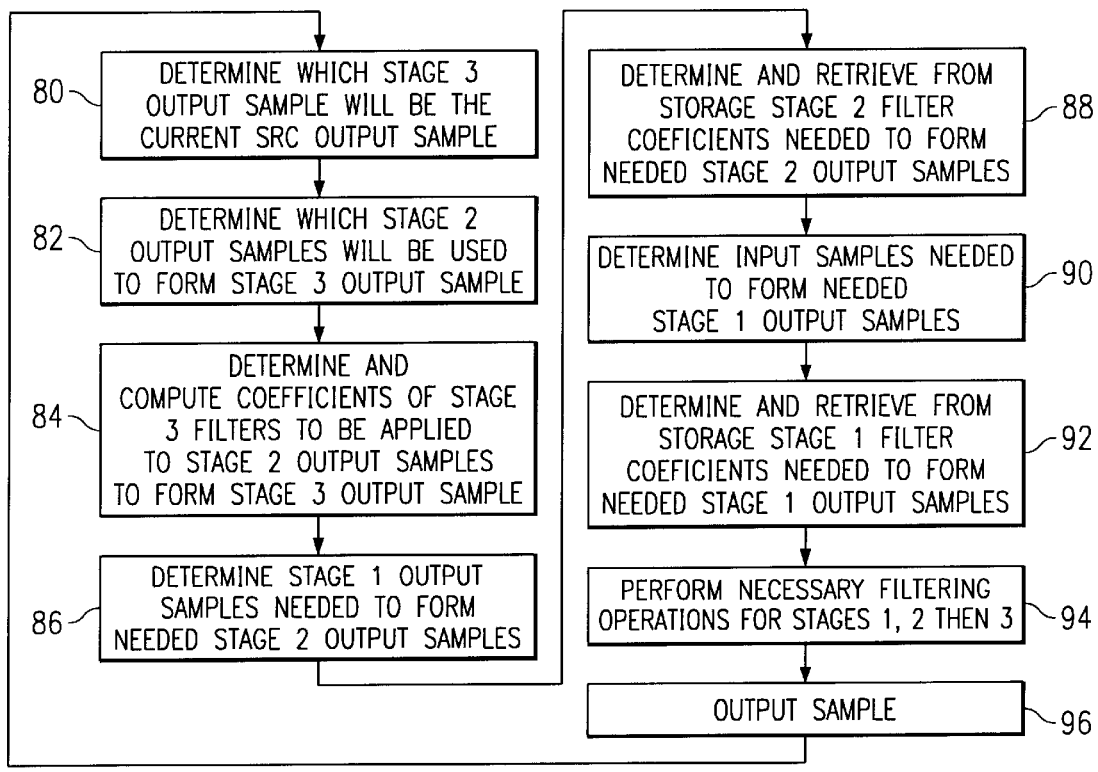
FIG. 5 is a flow chart showing the general method for indexing used in the preferred embodiment of the present invention.

An SRC procedure for converting samples provided at a rate of 48 kHz to a rate of 44.1 kHz will now be explained in detail, in conjunction with a Matlab listing implementing such procedure. This procedure includes a novel indexing scheme alluded to above. It will be recalled that it was pointed out that major increases in storage and processing efficiencies are obtained in the preferred embodiments by way of such novel indexing scheme. This indexing is best understood by working backwards from the output sample. FIG. 5 is a flow chart showing the steps in determining the current output sample. Thus, the first step 80 is to determine which stage-3 output sample will be the current SRC output sample. The second step 82 is to determine which stage-2 output samples will be used to form the appropriate stage-3 output sample. The third step 84 is to determine the coefficients of the stage-3 filters that will be applied to the stage-2 output samples to form the needed stage-3 output sample, and to compute those coefficients. The fourth step 86 is to determine the stage-1 output samples needed to form the needed stage 2 output samples. The fifth step 88 is to determine the stage-2 filter coefficients needed to form the needed stage-2 output samples, and then to retrieve those coefficients from storage. The sixth step 90 is to determine the input samples needed to form the needed stage-1 output samples. The seventh step 92 is to determine the stage-1 filter coefficients needed to form the needed stage-1 output samples, and then to retrieve those coefficients from storage. The eighth step 94 is to perform the necessary filtering operations for stages 1, 2, then 3. The ninth step 96 is to output the sample and return to the first step 80.

Figure 6:
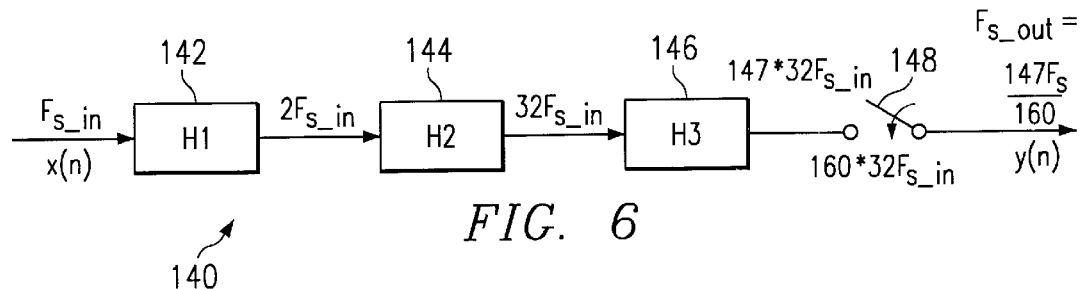
FIG. 6 is a block diagram of a simplified model for explaining the indexing used in the preferred embodiment of the present invention.

The process described above generally, in connection with FIG. 5 will now be explained in more detail. First, FIG. 6 is a simplified block diagram showing an SRC filter 140, based on the SRC filter 40 of FIG. 4, for the case where $R_3=147$, $S=5120$ (this is for the case of 48 kHz to 44.1 kHz conversion). The input sample rate $F_{s\_in}$ is referred to here, and hereinafter in this document, as $F_s$, to simplify notation. Thus, the output of the stage-1 expander/filter 142 is provided at a rate of $2F_s$. The output of the stage-2 expander/filter 144 is provided at a rate of $32F_s$. The output of the stage-3 expander/filter 146 is provided at a rate of $147*32F_s$. Decimation is performed by selecting output samples from the output of the stage-3 expander/filter 146 at the rate of $160*32F_s$, as shown by switch 148. The resulting output y(n) is a stream of samples provided at a rate of $$\left(\frac{147}{160}\right)F_s.$$

Since out of 147*32=4704 samples only $$\left(\frac{147}{160}\right) \approx 1$$

samples are actually provided as output samples, many samples output from the stage-3 expander/filter 146 are discarded. The preferred embodiment takes advantage of this and only calculates those samples actually provided as output samples. Some additional calculation is performed in order to accomplish this, but since the reduction in sample calculations is by a factor of over 4,000, this additional calculation results in a significant reduction in memory and processing requirements.

Figure 7:
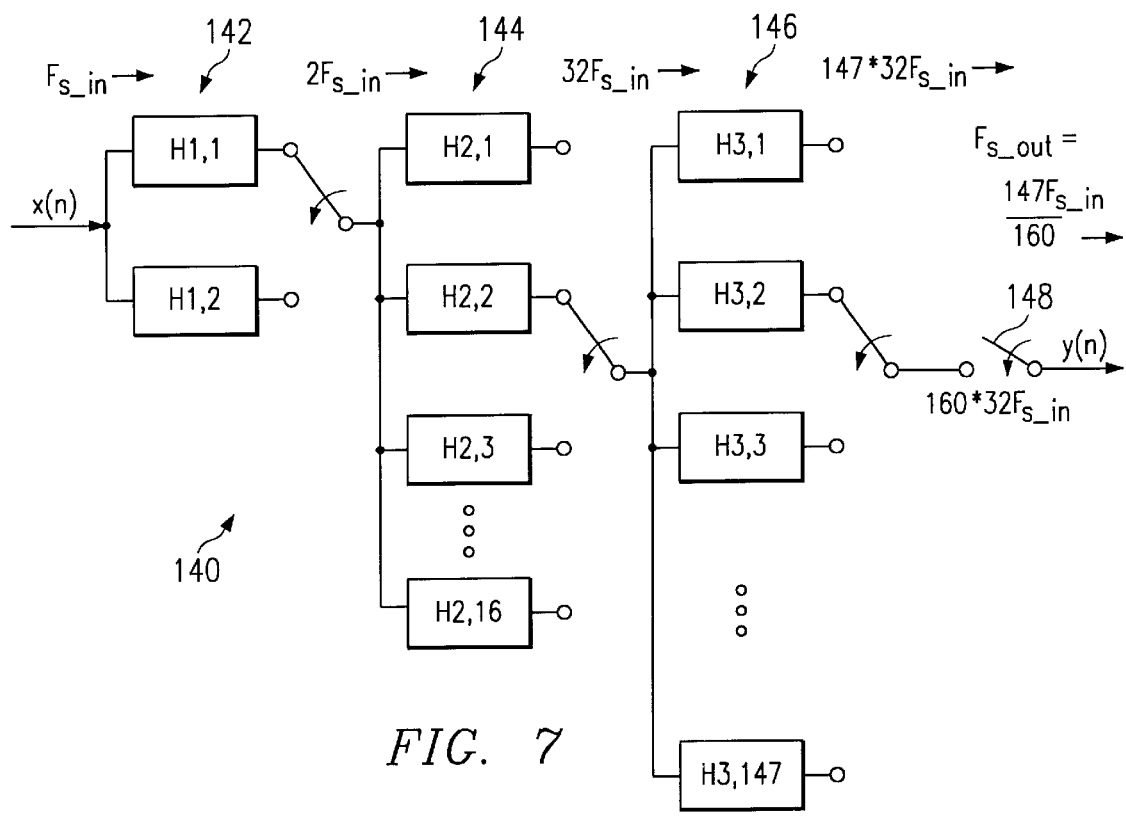
FIG. 7 is a block diagram of a more detailed model for explaining the indexing used in the preferred embodiment of the present invention.

FIG. 7 is a block diagram of the SRC filter 140 of FIG. 6 expanded in detail to assist in understanding the selection process back through the stages, as explained above in connection with FIG. 5. In implementing the functionality of FIG. 7, FIG. 8 will also be referred to, to show how to index the SRC system such that only necessary computations are carried out.

Figure 8:
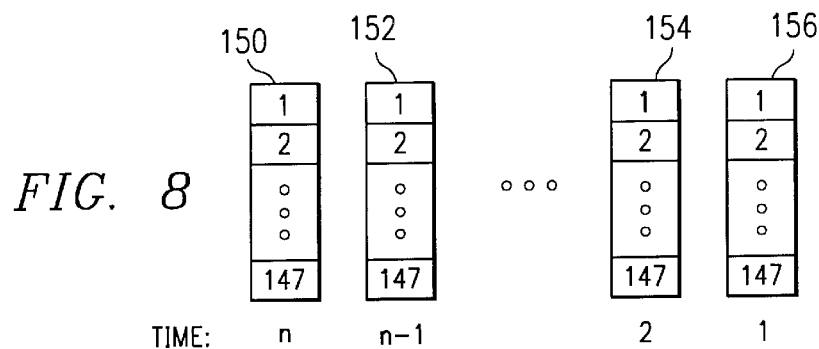
FIG. 8 is a schematic diagram depicting a data output stream as a series of vectors.

Note first that if the indexing scheme were not being used, a data stream at 32*147*Fs would be seen prior to the downsampling, or decimation, step. However, the downsampling step provided in the preferred embodiment of the present invention takes only one out of every 32*160 of these samples. Referring to FIG. 8, consider the output of stage 3 prior to downsampling to be vectors 150, 152, . . . , 154, 156, of 147 samples coming at a rate of 32Fs. This is true since there are 147 polyphase filters in stage 3 146 (FIG. 7). To accomplish the downsampling, it is determined which outputs, at which time steps, actually become outputs. After such determination, the method of the referred embodiment works backwards, as it were, to find out which samples must be used with which filter coefficients in the various stages to compute this output.

Table 2, below, shows which samples are used if there is a 147*32*Fs Hz data stream being downsampled by 160*32.

TABLE 2

| Output | Time | Filter |
|---|---|---|
| 1 | 1 | 1 |
| 32*160 + 1 | 35 | 123 |
| 2*32*160 + 1 | 70 | 98 |
| 3*32*160 + 1 | 105 | 73 |
| 4*32*160 + 1 | 140 | 48 |

This data are provided by determining which filter outputs provide desired samples, at which time steps For example, the $4^{th}$ output sample is sample 3*32*160+1 prior to downsampling. This is the output of filter 73 at time step 105. Notice that, since the output of stage 2 is running at 32Fs, the output of the stage 3 that is occurring at the $105^{th}$ time step is exactly that $105^{th}$ sample.

Table 3, below, shows the general equation used to compute the output samples needed, the stage 2 samples that correspond to those outputs, and the stage 3 filters that will be involved in computing the final output.

TABLE 3

| Output | Stage 2 Sample | Stage 3 Filter |
|---|---|---|
| 1 | 1 | 1 |
| 32*160 + 1 | 35 | 123 |
| 2*32*160 + 1 | 70 | 98 |
| 3*32*160 + 1 | 105 | 73 |
| 4*32*160 + 1 | 140 | 48 |
| O = (i − 1)*32*160 + 1 | $T_1$ = ⌈O/147⌉ | $F_1$ = O − (T − 1)*147 |

Table 4, below, shows the stage 2 filters and stage 1 samples needed to generate the downsampled data stream.

TABLE 4

| Stage 2 Sample | Stage 1 Sample | Stage 2 Filter |
|---|---|---|
| 1 | 1 | 1 |
| 2 | 1 | 2 |
| ... | ... | ... |
| 16 | 1 | 16 |
| 17 | 2 | 1 |
| ... | ... | ... |
| m | $T_2$ = ⌈m/16⌉ | $F_2$ = m − (T − 1)*16 |

The following Matlab code shows the specific case of 48 kHz to 44.1 kHz conversion. The efficient indexing scheme is applied only to the $2^{nd}$ and $3^{rd}$ stages, but could easily be extended to the $1^{st}$ stage as well. And, while this Matlab code shows only the case of 48 kHz to 44.1 kHz conversion, the teachings of this section can easily be extended to indexing schemes for any conversion rate.

Matlab Listing:

```
% Assumes 48 kHz in, 44.1 kHz out.
% 1 Channel—multiple channels are just replicas
function src
% stage 1 does not implement efficient indexing
% Zero pad
ss=zeros(1, 2*max(size(in)));
ss(1:2:end)=in;
% (for "in", start at 1, skip by two, continue to the end)
% Filter with stage 1 filter
ss=2*filter(H1_B, H1_A, ss);
% (the H1_B and H1_A vectors are read from storage)
% make polyphase filters, i.e., generate the FIR
  coefficients, for stage 2
% from non-polyphase stage 2 filter
for i=1:16
    H2(i, :)=16*H2(i:16:end);
end
% Compuation for stages 2 and 3
for i=1:fix(147*numpts/160)−9
    % subtract 9 since the first nine input samples are
      discarded
    % to simplify initialization.
    % stage 3 indicies
    O=(i−1)*160*32+1;
    T2=ceil(O/147);
    F2=O−(T2−1)*147;
    % stage 3 coefficients
    % function call; go to function "A", below
    C=coef(F2);
    % compute necessary stage 2 data
    for j=1:3
        % stage 2 indicies
        m=n+j−1;
        T1=ceil(m/16);
        F1=m−(T1−1)*16
        T1=T1+9;
        % adding 9 insures that the index will not go beyond
          the
        % file beginning, this is equivalent to discarding the
        % first 9 input samples.
        % perform stage 2 filters, i.e., convolve with stage 1
          output
        vec(j)=147*B2(F1, :)*ss(T1:−1:T1−8)';
    end
    % perform stage 3 filter
    in(i)=C*vec';
end
out(1:fix(147*numpts/160)−9)=in(1:fix(147*numpts/
  160)−9);
% Compute Stage 3 Filter Coefficients
% function "A":
function C=coef(m)
C=zeros(1, 3);
% calculate Eq. (6) (from text, above)
for i=1:3
    n=(i−1)*147+m;
    if n>=1 & n<147
        C(i)=n*(n+1)/2;
    elseif n>=147 & n<2*147
        C(i)=147*(147+1)/2+(n−147)*(2*147−1−n);
    elseif n>=2*147 & n<3*147−1
        C(i)=(3*147−n−1)*(3*147−n)/2;
    end
end
% prepare for convolving
C=fliplr(C)/3176523;
```

A further implementation variation will now be discussed, that is, the use of the interpolation filter in a Σ-Δ oversampling D/A converter in the place of the stage-1 expander/filter 22 and the stage-2 expander/filter 24 of the SRC system 20 of FIG. 2. In this way, an SRC function may readily be incorporated into a Σ-Δ oversampling D/A converter.

Note, however, that whereas a normal SRC filter does not have oversampled output values, a Σ-Δ oversampling D/A converter requires oversampled signals to feed the digital modulator. Therefore, it is important not to simply add a Σ-Δ D/A interpolation filter to an SRC constructed in accordance with the principles of the present invention, because, for example, the stage-3 expander/filter 26 of FIG. 2 may have to generate many more output samples in such a case. Inventive principles to accomplish such a combination will now be described.

First, it is advantageous to employ a modified SRC filter that produces an output sampled at a sample rate eight times its Nyquist sample rate. This takes advantage of a known interpolation filter technique in a Σ-Δ oversampling D/A converter, that is, to upsample signals to an eightfold sample rate using a lowpass filter followed by a sample-and-hold circuit that boosts the sample rate to a higher level, for example to 128 times the original sample rate.

Implementing such an embedded SRC filter adds considerable computational complexity. To reduce the computational complexity, two optional implementations may be employed. First, note that the interpolation filter performance in a Σ-Δ oversampling D/A converter can be lower than that of a normal SRC filter, since high-frequency shaped noise is introduced by a digital modulator. Therefore, a filter with an 80-dB stopband rejection may be employed. As a result, for a selection of $R_2=8$ the performance of $H_3(z)$ is now higher than adequate.

Figure 9:
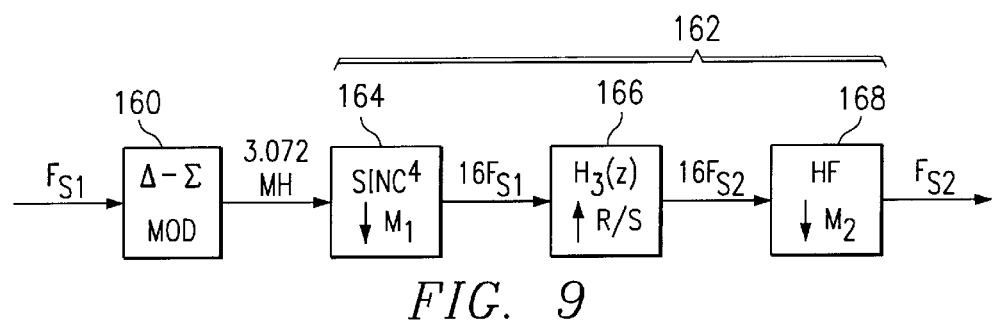
FIG. 9 is a diagram of an SRC filter that utilizes a $\Sigma$-$\Delta$ modulator.

FIG. 9 is a diagram of a decimation filter 162 that follows a Σ-Δ modulator 160. The modulator 160 works at a rate of $F_{mod}=3.072$ MHz that is typically an oversampled rate of 64 to 384 times the first sample rate $F_{S1}$. A fourth-order SINC filter 164 is employed to downsample the modulator output signals to a rate of $16F_{S1}$. Then, a simple filter 166 such as the stage-3 expander/filter 26 of FIG. 2, with an order of $N=r(S-1)$, is used to convert the sample rate at the SINC filter 164 output into a rate of 16 times the final sample rate $F_{S2}$.

This simple filter 166 performs an SRC function with a ratio of R/(S=160). It should be pointed out that the order of the filter is based on the decimation factor S rather than the interpolation factor R. The reason for the modification lies in the fact that there is now an anti-aliasing requirement, while such a condition is not required in other embodiments described above. In this embodiment, however, R has been optimized to have only three possible values: 144, 147 or 160. Note that when R=160 a bypass function results. The final stage 168 is a 16:1 decimator.

All possible SRC cases are summarized in Table 5. From an inspection of Table 5 it is apparent that a wide range of frequently used audio sample rates may be converted using this approach.

TABLE 5

Sample Rates in A ·Σ-·Δ A/D with SRC

| $M_1$ | $16F_{S1}$ | R/(S = 160) | $16F_{S2}$ | $M_2$ | $F_{S2}$ |
|---|---|---|---|---|---|
| 4 | 768k | 1 | 768k | 16 | 48k |
| 4 | 768k | 147/160 | 705.6k | 16 | 44.1k |
| 6 | 512k | 1 | 512k | 16 | 32k |
| 8 | 384k | 147/160 | 352.8k | 16 | 22.05k |
| 10 | 307.2k | 1 | 307.2k | 16 | 19.2k |
| 12 | 256k | 1 | 256k | 16 | 16k |
| 12 | 256k | 144/160 | 230.4k | 16 | 14.4k |
| 16 | 192k | 147/160 | 176.4k | 16 | 11.025k |
| 20 | 153.6k | 1 | 153.6k | 16 | 9.6k |
| 24 | 128k | 1 | 128k | 16 | 8k |
| 24 | 128k | 144/160 | 115.2k | 16 | 7.2k |

The design example shows that an inband SNR of over 90 dB can easily be achieved by using the decimation/SRC filter in FIG. 9 with four typical half-band FIR filters performing a decimation of $M_2=16$, just like those filters employed in normal Σ-·Δ oversampling A/D converters.

A compact filter procedure is now provided that implements the 'stage-3' filter $H_3(z)$ 166 in FIG. 9 as follows:

```
// The 'Stage-3' Filter Calculation Program
// The SRC ratio is R/S: R is the interpolation and S the decimation ratio.
// L=r(S•-1)+1 is the 'stage-3' filter's impulse response length.
// M=Floor(L/R) is the maximum number of terms calculated for each output.
// INPUT is an array of delayed input values.
// INPUT[0] is the most recent input.
// The RESAMPLER_INDEX register keeps track of when an output may be
// calculated as well as providing the convolutional offset between the
// input sequence and the filter impulse response. Filter coefficients can be
// evaluated based on (5) or (6) with R_3 being replaced by S=160.
1) Initialization
   RESAMPLER_INDEX = R;
   INPUT[all] = 0;
2) do forever {
   wait for new input;
   RESAMPLER_INDEX = RESAMPLER_INDEX-R;
   while RESAMPLER_INDEX < R do {
       SUM = 0;
       COEFFICIENT_INDEX = RESAMPLER_INDEX + 1;
       for DATA_INDEX = 0 to M•-1 do {
           SUM = SUM + INPUT[DATA_INDEX]
   FILT(COEFFICIENT_INDEX);
           COEFFICIENT_INDEX = COEFFICIENT_INDEX + R;
           if COEFFICIENT_INDEX > L then exit the inner loop; }
       y(n) = SUM; // y(n) is the output
       RESAMPLER_INDEX = RESAMPLER_INDEX + S; }
   }
```

Although the present invention and its advantages have been described in detail, it should be understood that various changes, substitutions and alterations can be made herein without departing from the spirit and scope of the invention as defined by the appended claims.

APPENDIX A

Stage-1 Filter Coefficients

| | | |
|---|---|---|
| −0.00000800008031 | −0.00312368468930 | 0.00079449580461 |
| 0.00002524520299 | 0.01429804952811 | 0.00489531743842 |
| 0.00012749245978 | 0.01194602726347 | 0.00172250243655 |
| 0.00023168895216 | −0.01029924266330 | −0.00326181826590 |
| 0.00018596926860 | −0.02038200385225 | −0.00303446960299 |
| −0.00004173798314 | 0.00073482566492 | 0.00123561352837 |
| −0.00022236139097 | 0.02548598834348 | 0.00312720489457 |
| −0.00009395165195 | 0.01401306932399 | 0.00050741782361 |
| 0.00022798310620 | −0.02391373911549 | −0.00233378596337 |
| 0.00028236300811 | −0.03230583189130 | −0.00156196018316 |
| −0.00011124263531 | 0.01201952643100 | 0.00114604821292 |
| −0.00045226922162 | 0.05147573458066 | 0.00183787295074 |
| −0.00015723875420 | 0.01540870560244 | −0.00002733586373 |
| 0.00049028087929 | −0.06834265722374 | −0.00149994275425 |
| 0.00052766243454 | −0.07388677535303 | −0.00071764271163 |
| −0.00029280537329 | 0.07990266018034 | 0.00084653891504 |
| −0.00086818706856 | 0.30676295531302 | 0.00099041381460 |
| −0.00017897003432 | 0.41556780905067 | −0.00017897003432 |
| 0.00099041381460 | 0.30676295531302 | −0.00086818706856 |
| 0.00084653891504 | 0.07990266018034 | −0.00029280537329 |
| −0.00071764271163 | −0.07388677535303 | 0.00052766243454 |
| −0.00149994275425 | −0.06834265722374 | 0.00049028087929 |
| −0.00002733586373 | 0.01540870560244 | −0.00015723875420 |
| 0.00183787295074 | 0.05147573458066 | −0.00045226922162 |
| 0.00114604821292 | 0.01201952643100 | −0.00011124263531 |
| −0.00156196018316 | −0.03230583189130 | 0.00028236300811 |
| −0.00233378596337 | −0.02391373911549 | 0.00022798310620 |
| 0.00050741782361 | 0.01401306932399 | −0.00009395165195 |
| 0.00312720489457 | 0.02548598834348 | −0.00022236139097 |
| 0.00123561352837 | 0.00073482566492 | −0.00004173798314 |
| −0.00303446960299 | −0.02039200385225 | 0.00018596926860 |
| −0.00326181826590 | −0.01029924266330 | 0.00023168895216 |
| 0.00172250243655 | 0.01194602726347 | 0.00012749245978 |
| 0.00489531743842 | 0.01429804952811 | 0.00002524520299 |
| 0.00079449580461 | −0.00312368468930 | −0.00000800008031 |
| −0.00535468499783 | −0.01351188782368 | |
| −0.00403846539391 | −0.00388972863157 | |
| 0.00400977702922 | 0.00952642115799 | |
| 0.00708514672038 | 0.00790147137539 | |
| −0.00066361611960 | −0.00423331569757 | |
| −0.00874702117957 | −0.00874702117957 | |
| −0.00423331569757 | −0.00066361611960 | |
| 0.00790147137539 | 0.00708514672038 | |
| 0.00952642115799 | 0.00400977702922 | |
| −0.00388972863157 | −0.00403846539391 | |
| −0.01351188782368 | −0.00535468499783 | |

APPENDIX B

Stage-2 Filter Coefficients

| | | |
|---|---|---|
| −0.00000656642335 | −0.00667609485928 | −0.00699381729954 |
| −0.00000829347347 | −0.00605365327878 | −0.00704089968951 |
| −0.00001299396513 | −0.00509751898954 | −0.00685503945042 |
| −0.00001889619486 | −0.00378525193285 | −0.00647606554720 |
| −0.00002590564816 | −0.00210225610565 | −0.00594450502127 |
| −0.00003377059844 | −0.00004291296422 | −0.00530025283113 |
| −0.00004206176705 | 0.00238851614791 | −0.00458138407311 |
| −0.00005010239889 | 0.00517726864880 | −0.00382314240821 |
| −0.00005699368309 | 0.00829777990369 | −0.00305712544004 |
| −0.00006157598622 | 0.01171373342216 | −0.00231068193092 |
| −0.00006245406490 | 0.01537847794018 | −0.00160652184989 |
| −0.00005801156059 | 0.01923581503575 | −0.00096253565435 |
| −0.00004647574846 | 0.02322114491056 | −0.00039180669783 |
| −0.00002598701520 | 0.02726294492186 | 0.00009720076660 |
| 0.00000529261223 | 0.03128454006421 | 0.00050030613397 |
| 0.00004906099173 | 0.03520611288087 | 0.00081715607669 |
| 0.00010672316139 | 0.03894688805497 | 0.00105068232794 |
| 0.00017923064540 | 0.04242741926498 | 0.00120650256525 |
| 0.00026690249991 | 0.04557189914336 | 0.00129229867475 |
| 0.00036925440324 | 0.04831041122226 | 0.00131719649461 |
| 0.00048483111855 | 0.05058104253984 | 0.00129117601342 |
| 0.00061106542586 | 0.05233178003375 | 0.00122452909280 |
| 0.00074416388891 | 0.05352212044397 | 0.00112738671949 |
| 0.00087904339359 | 0.05412433393826 | 0.00100932243685 |
| 0.00100932243685 | 0.05412433393826 | 0.00087904339359 |
| 0.00112738671949 | 0.05352212044397 | 0.00074416388891 |
| 0.00122452909280 | 0.05233178003375 | 0.00061106542586 |
| 0.00129117601342 | 0.05058104253984 | 0.00048483111855 |
| 0.00131719649461 | 0.04831041122226 | 0.00036925440324 |
| 0.00129229867475 | 0.04557189914336 | 0.00026690249991 |
| 0.00120650256525 | 0.04242741926498 | 0.00017923064540 |
| 0.00105068232794 | 0.03894688805497 | 0.00010672316139 |
| 0.00081715607669 | 0.03520611288087 | 0.00004906099173 |
| 0.00050030613397 | 0.03128454006421 | 0.00000529261223 |
| 0.00009720076660 | 0.02726294492186 | −0.00002598701520 |
| −0.00039180669783 | 0.02322114491056 | −0.00004647574846 |
| −0.00096253565435 | 0.01923581503575 | −0.00005801156059 |
| −0.00160652184989 | 0.01537847794018 | −0.00006245406490 |
| −0.00231068193092 | 0.01171373342216 | −0.00006157598622 |
| −0.00305612544004 | 0.00829777990369 | −0.00005699368309 |
| −0.00382314240821 | 0.00517726864880 | −0.00005010239889 |
| −0.00458138407311 | 0.00238851614791 | −0.00004206107605 |
| −0.00530025283113 | −0.00004291296422 | −0.00003377059844 |
| −0.00594450502127 | −0.00210225610565 | −0.00002590564816 |
| −0.00647606554720 | −0.00378525193285 | −0.00001889619486 |
| −0.00685503945042 | −0.00509751898954 | −0.00001299296513 |
| −0.00704089968951 | −0.00605365327878 | −0.00000829347347 |
| −0.00699381729954 | −0.00667609485928 | −0.00000656642335 |

What is claimed is:

1. A method for providing a sample-rate conversion ("SRC") filter on an input stream of sampled data provided at a first rate, to produce an output stream of data at a second rate different from said first rate, comprising the steps of:

operating on said input stream of sampled data with a first interpolation filter routine to produce a first stream of intermediate data;

operating on said first stream of intermediate data with a second, cascaded interpolation filter routine, having a transfer function of:

$$H(z) = \left( \sum_{k=0}^{R_3-1} z^{-k} \right)^r,$$

wherein R is an interpolation factor of said second interpolation filter routine, and r is an effective number of cascade stages of said second interpolation filter routine, wherein r is greater than one, to produce a second stream of intermediate data; and operating on said second stream of intermediate data with a decimating filter routine to produce said output stream of data.

2. A method as in claim 1, further comprising the step of operating on said first stream of intermediate data with a third interpolation filter routine to produce a third stream of intermediate data;

and wherein said step of operating on said first stream of intermediate data is performed by operating on said third stream, rather than said first stream of intermediate data.

3. A method as in claim 2, wherein said step of operating with said second interpolation filter routine is performed by interpolating with a cascaded FIR digital interpolation filter having r filters in cascade relation, where r is an integer between 2 and 5, having coefficients that are all ones, having an order of $R_3-1$, and that provides said second stream of intermediate data at a rate $R_3$ times said first rate, where $R_3$ is an integer between 100 and 10,000.

4. A method as in claim 3, further comprising the step of applying an optimizing indexing procedure in performing instructions of said routines so as to execute fewer instructions that do not generate intermediate data on which said output stream of data is based.

5. A method as in claim 4, wherein said first interpolation filter routine and said second interpolation filter routine are implemented as polyphase filter routines.

6. A method as in claim 3, further comprising the step of applying an optimizing indexing procedure in performing instructions of said routines so as to execute all instructions that generate intermediate data on which said output stream of data is based, while causing instructions that do not generate intermediate data on which said output stream is based to not be executed.

7. A method as in claim 6, wherein said first interpolation filter routine and said second interpolation filter routine are implemented as polyphase filter routines.

8. A method as in claim 3, further comprising the step of applying an optimizing indexing procedure in performing instructions of said routines so as to execute only instructions that generate intermediate data on which said output stream of data is based.

9. A method as in claim 2, wherein said step of operating with said second interpolation filter routine is performed by interpolating with an FIR digital interpolation filter having an order of between 100 and 800, and that provides said first stream of intermediate data at a rate $R_1$ times said first rate, where $R_1$ is an integer less than six.

10. A method as in claim 2, wherein said step of operating with said third interpolation filter routine is performed by interpolating with an FIR digital interpolation filter having an order of between 100 and 1200, and that provides said second stream of intermediate data at a rate $R_2$ times said first rate, where $R_2$ is an integer between ten and thirty-six.

11. A method as in claim 1, further comprising the step of applying an optimizing indexing procedure in performing instructions of said routines so as to execute fewer instructions that do not generate intermediate data on which said output stream of data is based.

12. A method as in claim 11, wherein said first interpolation filter routine and said second interpolation filter routine are implemented as polyphase filter routines.

13. A method as in claim 1, further comprising the step of applying an optimizing indexing procedure in performing instructions of said routines so as to execute all instructions that generate intermediate data on which said output stream of data is based, while causing instructions that do not generate intermediate data on which said output stream is based to not be executed.

14. A method as in claim 13, wherein said first interpolation filter routine and said second interpolation filter routine are implemented as polyphase filter routines.

15. A method as in claim 1, wherein said step of operating with said second interpolation filter routine is performed by interpolating with a cascaded FIR digital interpolation filter having filters in cascade relation, where r is an integer between 2 and 5, having coefficients that are all ones, having an order of $R_3-1$, and that provides said second stream of intermediate data at a rate $R_3$ times said first rate, where $R_3$ is an integer between 100 and 10,000.

16. A method as in claim 1, further comprising the step of applying an optimizing indexing procedure in performing instructions of said routines so as to execute only those instructions that generate intermediate data on which said output stream of data is based.

17. A method as in claim 1, wherein said second, cascaded interpolation filter routine is implemented as a single stage, regardless of the number r.

18. A sample-rate conversion ("SRC") filter receiving an SRC input and outputting an SRC output, comprising:
  a first, interpolation filter receiving said SRC input;
  a second, cascaded interpolation filter receiving the output of said first filter, and having a transfer function of:

$$H(z) = \left( \sum_{k=0}^{R_3-1} z^{-k} \right)^r,$$

wherein $R_2$ is an interpolation factor of said second interpolation filter routine, and r is an effective number of cascade stages of said second interpolation filter routine, wherein r is greater than one; and
  a third, decimating filter receiving the output of said second filter.

19. A sample-rate conversion ("SRC") filter as in claim 18, further comprising a fourth, interpolation filter disposed intermediate said first filter and said second filter, receiving the output of said first filter, wherein said second filter receives the output of said fourth filter, rather than the output of said first filter.

20. A sample-rate conversion ("SRC") filter as in claim 18, further comprising means for automatically determining a subset of operations required to determine said SRC filter output, and for causing only said subset of operations to be performed.

21. A sample-rate conversion ("SRC") filter as in claim 18, further comprising means for automatically determining a subset of operations required to determine said SRC filter output, and for causing only said subset of operations to be performed.

22. A sample-rate conversion ("SRC") filter as in claim 18, wherein said second, cascaded interpolation filter routine is implemented as a single stage, regardless of the number r.

* * * * *